(12) United States Patent
Mahanpour

(10) Patent No.: US 6,485,361 B1
(45) Date of Patent: Nov. 26, 2002

(54) APPARATUS FOR HOLDING AND DELAYERING A SEMICONDUCTOR DIE

(75) Inventor: Mehrdad Mahanpour, Union City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 410 days.

(21) Appl. No.: 08/993,647

(22) Filed: Dec. 18, 1997

(51) Int. Cl.$^7$ ................................................. B24B 41/06
(52) U.S. Cl. ........................ 451/364; 451/390; 451/391
(58) Field of Search .................................. 451/364, 390, 451/391

(56) References Cited

U.S. PATENT DOCUMENTS

| | | | | |
|---|---|---|---|---|
| 3,166,875 A | * | 1/1965 | Litman | ........................ 451/390 |
| 3,906,678 A | | 9/1975 | Roth | |
| 4,098,031 A | * | 7/1978 | Hartman et al. | ........ 451/390 X |
| 4,512,113 A | * | 4/1985 | Budinger | ................ 451/390 X |
| 5,101,602 A | * | 4/1992 | Hashimoto | ................... 451/390 |
| 5,291,692 A | * | 3/1994 | Takahashi et al. | ...... 451/390 X |
| 5,679,065 A | * | 10/1997 | Henderson | .............. 451/391 X |
| 5,711,196 A | * | 1/1998 | Reid et al. | .............. 451/390 X |

FOREIGN PATENT DOCUMENTS

| | | | | |
|---|---|---|---|---|
| EP | 264572 | * | 4/1988 | ................. 451/390 |
| SU | 3934180 | * | 4/1990 | ................. 451/390 |

OTHER PUBLICATIONS

Article entitled "Infrared Imaging and Backside Failure Analysis Techniques On Multilayer CMOS Technology"; Steven Chen et al.; Proceedings of 6th IPFA '97; 1997; pp. 17–20.
Product information handout for "Multipol 2 Precision Lapping and Polishing Machine"; Ultra Tec Mfg., Inc.
Product information for "A Fast–Result Method of Planar Polishing for Optical Microscopy"; Joseph Rubin & Tim Hazeldine; Ultra Tec Mfg., Inc.; Reprinted from Microscopy Today, Issue 97–9, pp 12–13.
Product information for "Ultrapol 1200 Series Precision Lapping & Polishing Machines"; Ultra Tec Mfg. Inc.
Product information for "UT–1600 Series Micropositioned Polishing Heads"; Ultra Tec Mfg., Inc.

* cited by examiner

*Primary Examiner*—Timothy V. Eley
(74) *Attorney, Agent, or Firm*—Sawyer Law Group LLP

(57) ABSTRACT

A method and apparatus for holding and delayering a die include an outer member (10) that receives an inner member (20), and a set screw (25) and set screw hole (12) for securing the position of the inner member (20) within the outer member (10). A die (50) is attached to the inner member (20), and the apparatus is then used to apply the die (50) to an abrasive disk (200) which is attached to a rotatable wheel (300) and is delayered by progressive abrading. The outer member (10) provides stability and precision to the delayering operation. The inner member (20) provides portability and control to the delayering operation.

7 Claims, 4 Drawing Sheets

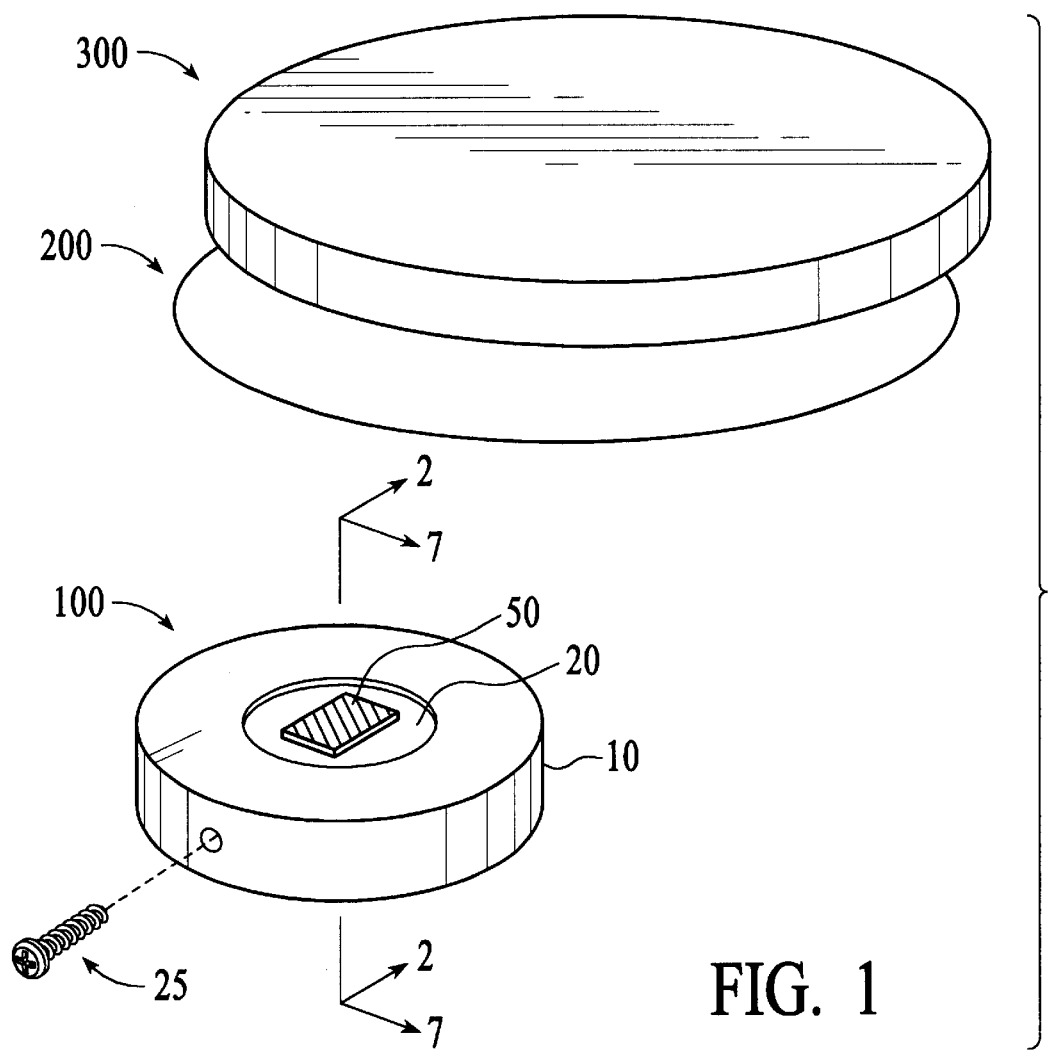
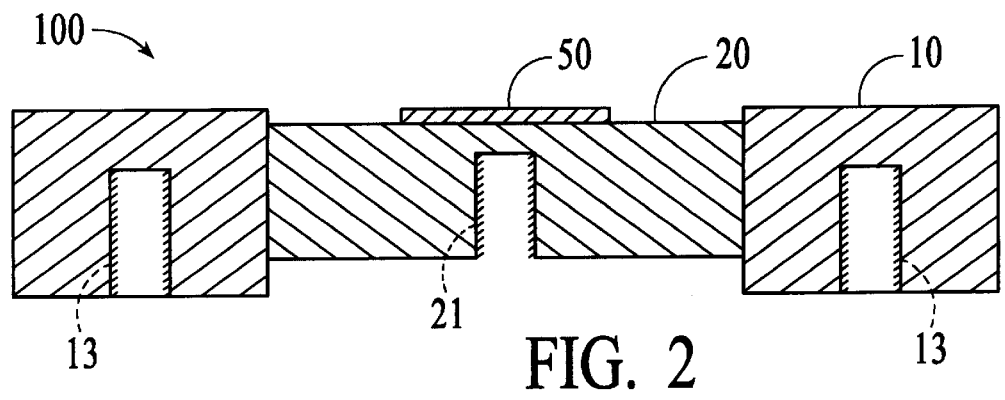

APPARATUS FOR HOLDING AND DELAYERING A SEMICONDUCTOR DIE

BACKGROUND OF THE INVENTION

The present invention relates to methods and tools used in failure analysis of integrated circuit (IC) products in the semiconductor industry, and more particularly to a method of mechanically delayering a semiconductor die (also called an integrated circuit chip) in a controlled manner, and an apparatus for carrying out the method.

IC circuits fail due to various physical, chemical or mechanical mechanisms such as electrical overstress, contamination, or wear out. Some failure analysis approaches and procedures require a die to be precisely delayered down to a particular layer to locate such mechanisms. The most well known method of mechanically delayering a die involves progressively abrading the die using a die holder, an abrasive, and a rotatable wheel. The die holder applies the die to the abrasive that is attached to the rotatable wheel.

The die holders currently used are often problematic and limited in their usefulness. These problems and limitations result from instability, imprecision and lack of portability. The prior art has attempted to address these concerns but has fallen short of producing desired and reliable results.

Instability, imprecision and lack of portability adversely affect delayering analysis in several ways. The conventional and most popular method is to secure a die to a die holder, then manually apply the die holder to a rotatable wheel, with the die exposed and sandwiched in-between. The disadvantage of this method is that it introduces inconsistent conditions due to finger pressure variance. Finger pressure variance causes certain portions of the die to be delayered at a faster rate, resulting in non-uniform abrading across the die. Finger pressure variance also significantly changes the abrading angle between the to-be-abraded die surface and the rotatable wheel. This lack of control of the force and directional components results in undesired die surface characteristics, which can be detrimental to delayering analysis. As will be discussed in detail later, delayering the die produces some die surface characteristics that are desirable and some that are undesirable. Lack of control in the delayering process is problematic when the failure mechanism evidence is destroyed from too much delayering.

Another method is to use a delayering attachment with a polishing machine. This method is intended to eliminate finger pressure variance, but instability of the die holder has been known to crack the die or, too often, delayer only one corner of the die. Users continue to use the attachment but therefore often revert to using it with the manual method as described above, rather than with the machine. This reintroduces the finger pressure variance problem.

Lack of portability also contributes to user problems. Lack of portability is the inability of the die holder to be directly used with other failure analysis equipment, for example, an optical microscope, a scanning electron microscope, or a plasma or dry etcher. Thus, prior art devices require the user to detach the delayered die from the holder, and then inspect the die in the appropriate analysis equipment, with another type of holder or without any holder. When more delayering is needed, the user places the die back onto the die holder for more delayering. This introduces undesired variables in the die position, so that if the die is tilted differently or rotated from its position when previously delayered, the abrading produces undesired die surface characteristics, as will be discussed in detail later. The analysis for that particular die is then at an end.

A need therefore remains for a mechanical die delayering method and apparatus that precisely control the abrading angle such that the die is abraded more uniformly. The apparatus also needs to be portable allowing the user to place the die sample in other failure analysis tools without having to remove the die from the die holder Accordingly, the first objective of the invention is to control the abrading angle. The abrading angle is the angle between the die surface to be abraded and the rotatable wheel. When the die is abraded using a rotatable wheel, a rainbow appears on the die. The rainbow rings on the die can adversely affect visual analysis of particular die circuits, specifically when the rings pass over and obscure transistors of interest. There is no known method of eliminating these rings. The rainbow effect, however, is not a problem when there is a sufficient distance between rainbow rings and the direction of the rings can be controlled. While the required distance will vary with the size of the circuit to be analyzed, a distance of 10 microns will usually suffice; a distance of 1000 microns is ideal. To obtain the maximum distance between rainbow rings, the abrading angle must be decreased to and sustained at a maximum of one degree.

The second objective is to abrade the die more uniformly by decreasing any wobbling that might occur during the delayering procedure. Any wobbling increases the pressure differential. This causes multidirectional rainbow rings, too many of which impair visual analysis of the die. Uniform delayering produces desired unidirectional rainbow rings.

The third objective is to allow the user to place the die sample in other failure analysis tools without having to remove the die from the die holder. The present invention provides that capability by enabling the die to be used intermittently in different tools during the entire delayering process without ever changing its position relative to the die holder.

SUMMARY OF THE INVENTION

The present invention meets the above needs and objectives with a new and improved method of delayering a die in a controlled manner, and a new and improved die holder therefor in which the geometry is such that it provides stability and precision to a die delayering process.

In the preferred embodiment, the die holder according to the present invention includes concentric inner and outer cylinders which can be axially adjusted relative to each other. The die which is to be delayered is attached to one end of the inner cylinder, and this end of the cylinder, with the die attached, is positioned just inside the corresponding surface of the outer cylinder so that the die is barely exposed above the adjacent outer cylinder surface. The cylinders and die are then locked in this position, such as by a set screw, following which the assembly is applied against a conventional rotating wheel and abrasive to delayer the die as desired.

The present invention provides precise control, stability, and precision to the process through the ability to carefully control the amount that the die is exposed (the "exposure increment") and the maximum possible angle ("wheel angle") at which the die surface may be removed or abraded. The dimensions of the cylinders (and particularly the width of the outer cylinder surface) are maintained to keep the wheel angle, ideally, less than one degree. The exact dimensions, of course, will depend upon the actual size of the die, transistor geometries, and the anticipated variations from one sample to another, including variations in the adhesive thickness which holds the die on the end of the inner cylinder. The end result produces the desired delayering or die surface characteristics (the so—called broad "rainbow rings") on a consistent, reliable, and easily produced basis.

The adjustability of the cylinders relative to each other, so that only a very small exposure increment needs to be utilized, also provides for keeping the die holder quite compact relative to die analysis equipment, yet with no loss of precision and performance in the delayering operation. This means that the die can remain attached to the mount during subsequent analysis operations, and then for still further delayering operations thereafter. Not only is this significantly more convenient for the user, but it expedites the diagnostic processes and provides for substantially improved precision in such sequential operations.

It is therefore an object of the present invention to provide a new and improved method and apparatus for delayering dies; wherein the die holder comprises, in combination, an inner member, one surface of the inner member being at least as large as the die which is to be delayered, the outer member having an exteriorly open hole therein, the hole being large enough to removably receive the inner member entirely therein, the hole also being deep enough to provide for receiving the inner member in a position wherein the one surface of the inner member would be beneath the exterior of the hole at a depth substantially as deep as the thickness of the die which is to be delayered, the members being configured to permit the inner member to move inwardly and outwardly through the hole opening, at least one positioner connected to at least one of the members for positioning the inner member relative to the opening, such that, when the die is attached to the one surface, the exposed to-be-delayered die surface is exposed at a predetermined increment just outside the hole opening, the predetermined increment subtending an exposure angle between the highest plane defined by the surface of the outer member around the hole opening and the highest point of the exposed to-be-abraded die surface above the plane, and the predetermined increment defining the exposure angle to be less than substantially two degrees; in which a lock may be configured for locking the inner member relative to the outer member, the lock including a set screw configured for securing the inner member in the hole and a means defining a threaded opening extending from the exterior of the outer member into the hole for adjustably receiving the set screw; in which the die holder inner member may be positioned relative to the outer member such that the exposed die surface is substantially parallel with the highest plane; in which the die holder inner member may be a cylinder, one surface being one end of the cylinder; in which the die holder outer member may also be a cylinder, the hole being substantially the same size as the diameter of the inner cylinder for receiving the inner cylinder for movement longitudinally and coaxially within the outer cylinder; and to accomplish the above objectives and purposes in an inexpensive, uncomplicated, durable, versatile, and reliable method and apparatus, inexpensive to manufacture, and readily suited to the widest possible utilization.

These and other objects and advantages of the invention will be apparent from the following description, the accompanying drawings, and the appended claims.

BRIEF DESCRIPTION OF THE DRAWINGS

Certain embodiments of the present invention are described, reference being made to the accompanying drawings, wherein:

FIG. 1 is a perspective view of an embodiment of the present invention.

FIG. 2 is a cross-sectional view of the FIG. 1 assembly taken on line 2—2 thereof.

DESCRIPTION OF THE PREFERRED EMBODIMENT

Figure 3:
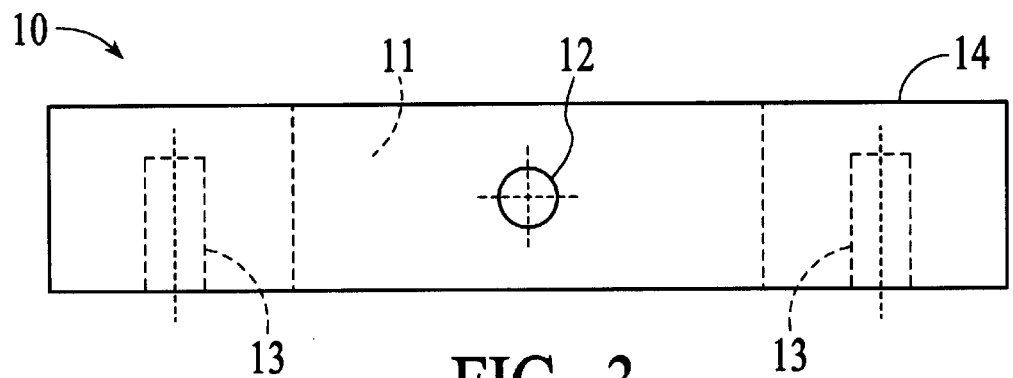
FIG. 3 is a side view of the outer member shown in FIG. 1, showing a threaded hole.

With reference to the drawings, the new and improved method for holding and abrading a die, and the apparatus for carrying out the method according to the present invention, will now be described.

FIG. 1 shows a perspective view of the preferred embodiment of the present invention 100, including an outer member 10, an inner member 20, a locking means 25, a die 50, an abrasive 200, and a rotatable wheel 300.

Figure 4:
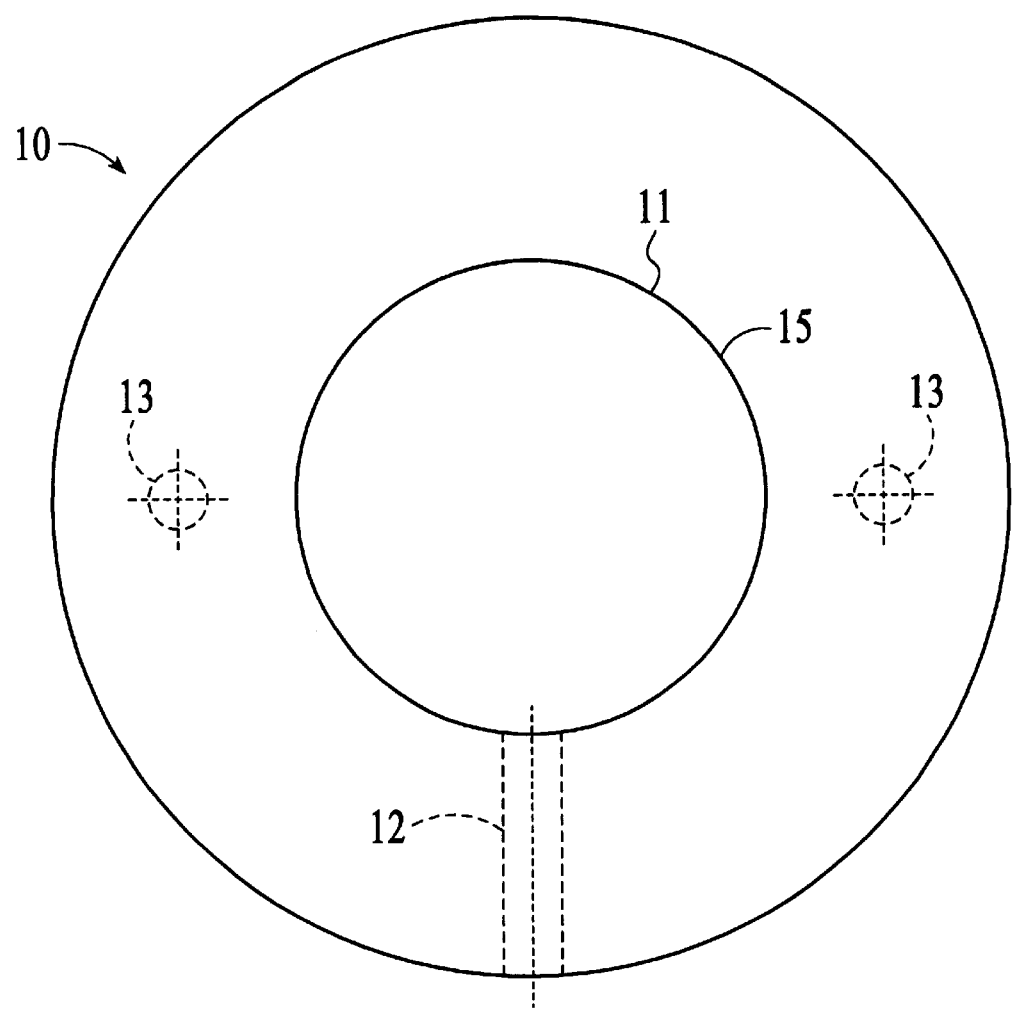
FIG. 4 is a top view of the outer member shown in FIGS. 1 and 3.

FIG. 3 shows a side view of the outer member 10 of the present invention. In the illustrated embodiment, the outer member 10 is a cylinder with four holes 11, 12, and 13. Hole 11 (FIG. 4) is a cylindrical receiving hole which passes longitudinally and coaxially through the outer member 10. Hole 12 is a threaded set screw hole which passes through the side of the outer member 10 to the receiving hole 11. Two threaded mount screw holes 13 are located on the bottom side of the outer member 10.

Figure 5:
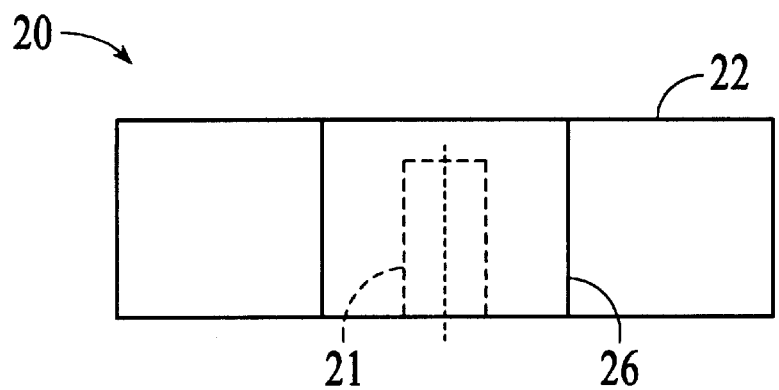
FIG. 5 is a side view of the inner member shown in FIG. 1, showing a flattened side portion also shown in FIG. 6.
Figure 6:
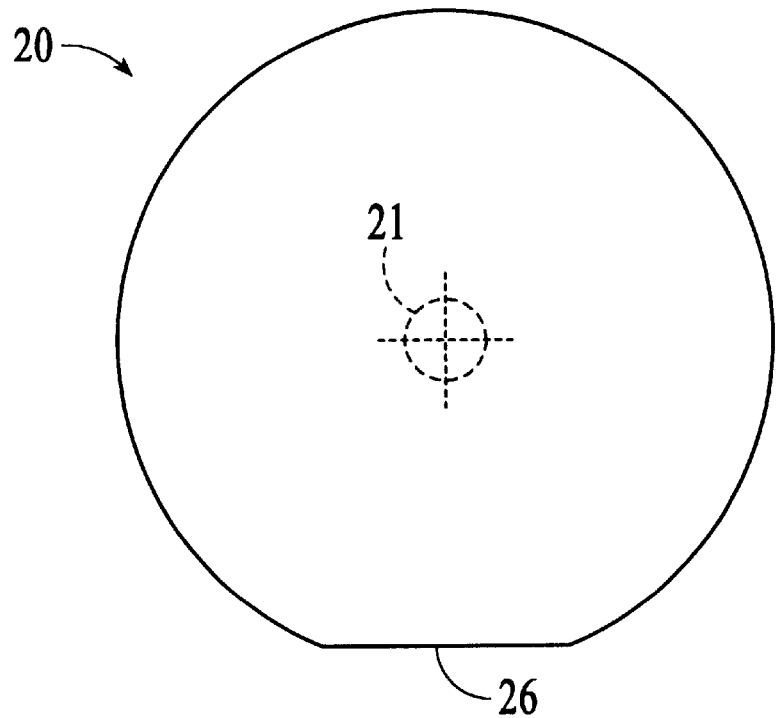
FIG. 6 is a top view of the embodiment of the inner member shown in FIGS. 1 and 5.

FIG. 5 shows a side view of the preferred embodiment of the inner member 20 of the present invention. Member 20 is a cylinder with one threaded mount screw hole 21 located on its bottom side.

Figure 7:
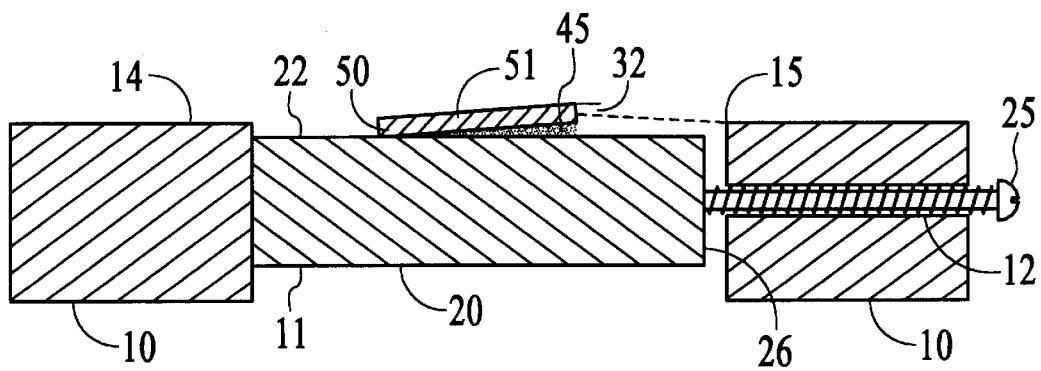
FIG. 7 is a cross-sectional view taken on line 7—7 of FIG. 1.
Figure 9:
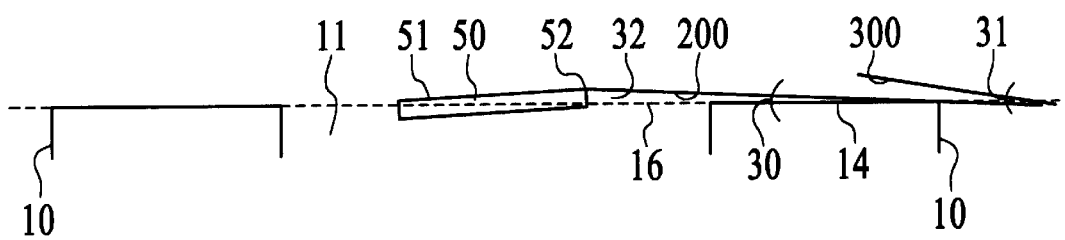
FIG. 9 is a figurative geometric illustration of the planes and angles defined by the several surfaces and elements of the invention.

The outer member 10 (FIG. 7) entirely receives the inner member 20 into the receiving hole 11 such that the top surface 22 of the inner member 20 is parallel with the top surface 14 of the outer member 10, and such that it is beneath the receiving hole 11 opening 15 of the outer member 10 surface 14 at a depth substantially as deep as the thickness of the die 50 which is to be delayered. A set screw 25 locks the inner member 20 at a predetermined position relative to the outer member 10. The set screw extends through the set screw hole 12 from the exterior of the outer member 10 into the set screw hole 12 and abuts a flat portion 26 on the side of the inner member 20. The inner member 20 is positioned such that when the die 50 is attached to its top surface 22, the exposed to-be-abraded surface 51 of the die 50 is exposed at a predetermined exposure increment 32 (FIGS. 7 and 9) just outside the receiving hole 11 opening 15. This predetermined increment 32 subtends an exposure angle 30 (FIG. 9) between the top of the highest point 52 of the exposed to-be-abraded die surface 51 and the highest plane 16 around the receiving hole 11 of the outer member 10. The three highest points (not shown) on the outer member 10 define the highest plane 16. The predetermined increment 32 is preferably adjusted to define an exposure angle 30 less than one degree.

In known fashion, an abrasive disk 200 (FIG. 8) then abrades the die 50 down to a desired die layer. A rotatable wheel 300 provides a firm and flat support for the abrasive disk 200 as the die 50 is applied by force against the abrasive disk 200. The abrasive disk 200 (also referred to herein as the "abrasive") is firm so that it does not bunch up and is pliable such that all portions of the die 50 contact the abrasive 200 and are delayered. If the rotatable wheel 300 is positioned such that it faces upward, with the die 50 facing and being forced downward, a liquid slurry with acid can be used in place of an abrasive disk 200. In either case, because all portions of the die surface 51 are exposed to abrading action, the factor principally causing the variance in the abrading rate is the force that is applied to any given point on the die 50 by the abrasive 200—the greater the force, the faster the delayering rate.

The wheel angle 31 (FIG. 9) is the angle between the highest plane 16 of the top surface 14 of the outer member 10 and the rotatable wheel 300. Two features of the invention minimize the wheel angle 31. These features are the outer member width 17 (FIG. 8) and the ability to control the exposure increment or degree of die exposure 32. The outer member width 17 defines the distance 33 from the outer perimeter of the outer member 10 to the top of the die. The degree of die exposure 32 defines the distance 32 (FIG. 9) from the top of the die to the top surface 14 of the outer member 10. The larger the ratio between the length of the outer member width 17 to the degree of die exposure 32 the smaller the wheel angle 31. In this case, the outer member width 17 is sufficiently wide and the die exposure 32 is sufficiently small such that the wheel angle 31 is minimized such that the highest plane 16 of the top surface of the outer member 10 is essentially flat against the rotatable wheel to which it is applied. When the wheel angle 31 is minimized, any tilt due to the exposure angle 30 is also minimized.

Figure 8:
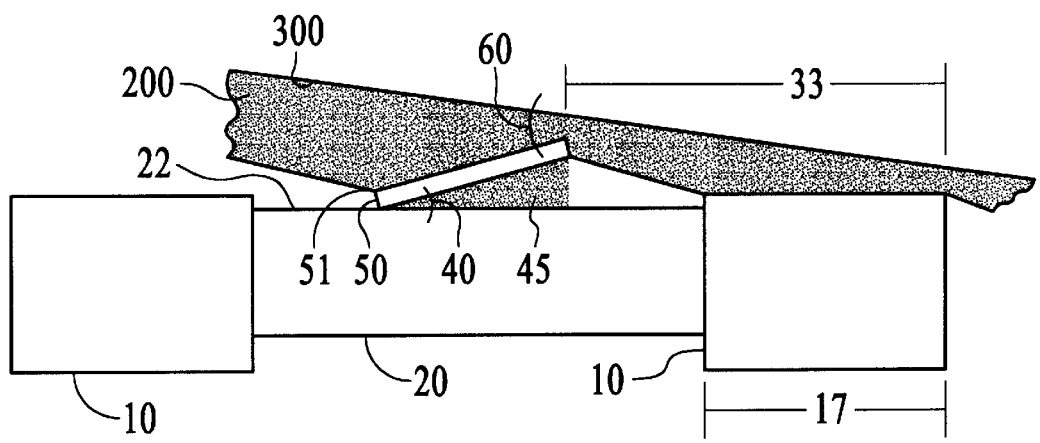
FIG. 8 is an exaggerated figurative drawing of the FIG. 1 assembly with portions of the invention omitted for clarity of illustration.

Even with the wheel angle 31 essentially at zero degrees, with the outer member 10 flat against the rotatable wheel 300, there will always be a small tilt angle component 40 (FIG. 8) added or subtracted to the die 50 relative to the rotatable wheel due to the inherent thickness and unevenness of the adhesive 45 which attaches the die 50 to the inner member 20 surface 22. The adhesive 45 used is typically glue or wax. There is no current means of completely eliminating this tilt 40. This tilt 40 thus ultimately defines the abrading angle 60 (FIG. 8).

The slight tilt 40 in the die 50 due to the adhesive 45 is actually desired. As mentioned above, when the die 50 is delayered using a rotatable wheel 300, the conventional method, a rainbow appears on the die. The rainbow rings on the die 50 can adversely affect visual analysis of particular die circuits, specifically when the rings pass over and obscure transistors of interest. This is an undesired die surface characteristic. This rainbow effect is not a problem when there is sufficient distance between rainbow rings. While the required distance will vary with the size of the circuit to be analyzed, a distance of 10 microns will usually suffice; a distance of 1000 microns is ideal. To obtain the maximum distance, the abrading 60 angle must be minimized to, ideally, less than one degree. If the abrading angle 60 is at zero degrees, however, concentric circles appear, rather than the rainbow rings. These circles significantly interfere with-visual analysis. Also, the distances between such circles are too short and cannot be controlled. This undesired die characteristic is eliminated by the tilt 40. The tilt 40 is substantially less than one degree and therefore enhances the quality of the entire analysis procedure.

The width 17 of the outer member 10 and the ability to recess the die into hole 11 essentially eliminates any wobbling that might occur during the delayering process. This allows the die to be abraded uniformly as it minimizes any pressure differential as the die is being delayered. As mentioned above, a die that is not delayered uniformly is problematic to the analysis because it causes multidirectional rainbow rings, too many of which impair visual analysis of the die. Uniform delayering provided by the current invention produces desired unidirectional rainbow rings.

The outer member 10 is small enough to allow the user to place the die sample 50 in other failure analysis tools without having to remove the die 50 from the die holder. As stated above, other tools include the optical microscope, scanning electron microscope, and plasma etcher. As stated above, undesired die surface characteristics result when the die is attached to the holder, delayered, detached from the holder, reattached, then delayered again. The present invention avoids these undesired die characteristics, because the die 50 can be intermittently used in different tools during the entire delayering process without ever changing its position relative to the die holder. For certain types of analysis equipment, such as the scanning electron microscope, the inner member 20 can be detached from the outer member 10 and mounted onto the scanning emission microscope via the mount screw hole 21 on the bottom of the inner member 20.

As may be seen, therefore, the present invention provides numerous advantages. Principally, it eliminates problems and limitations resulting from instability, imprecision and lack of portability, problems that the prior art has failed to resolve satisfactorily.

Other variations on the present invention will occur after reading and understanding the present disclosure. One such change for example might be the use of a micrometer adjuster or loaded spring as the positioner.

Therefore, while the methods and forms of apparatus herein described constitute preferred embodiments of this invention, it is to be understood that the invention is not limited to these precise methods and forms of apparatus, and that changes may be made therein without departing from the scope of the invention.

What is claimed is:

1. A die holder for delayering a die, comprising, in combination:
   a) an inner member, said inner member having at least one surface;
   b) an outer member having an exteriorly open hole therein, said outer member having a surface around said hole, said hole having an exterior;
   c) said hole being large enough to removably receive said inner member entirely therein;
   d) said hole also being deep enough to provide for receiving said inner member in a position wherein said one surface of said inner member would be beneath the exterior of said hole at a depth substantially as deep as the thickness of the die, said die having a die surface, the highest point of the die surface being above the exterior of said hole;
   e) said members being configured to permit said inner member to move inwardly and outwardly through said hole;
   f) at least one positioner connected to at least one of said members for positioning said inner member relative to said hole, such that, when the die is attached to said one surface, the exposed to-be-delayed die surface is exposed at a predetermined increment just outside said hole;

g) said predetermined increment subtending an exposure angle between the highest plane defined by the surface of said member around said hole and the highest point of said exposed to-be-delayed die surface above said plane; and h) said predetermined increment defining said exposure angle to be less than substantially two degrees.

2. A die holder as in claim 1 wherein said predetermined increment defines said exposure angle to be less than substantially one degree.

3. A die holder as in claim 1, further comprising a lock configured for locking said inner member relative to said outer member.

4. A die holder as in claim 3 wherein said lock further comprises means defining:

a) a set screw configured for securing said inner member in said hole; and b) a threaded opening extending from the exterior of said outer member into said hole for adjustably receiving said set screw.

5. A die holder as in claim 1 wherein said inner member is positioned relative to said outer member such that said exposed to-be-delayered die surface is substantially coplanar with said highest plane.

6. A die holder as in claim 1 wherein said inner member is a cylinder, said one surface being one end of said cylinder.

7. A die holder as in claim 1 wherein said members are cylinders, said hole being substantially the same size as the diameter of said inner cylinder for receiving said inner cylinder for movement longitudinally and coaxially within said outer cylinder.

* * * * *